United States Patent
Fantini et al.

(10) Patent No.: US 10,700,128 B1
(45) Date of Patent: Jun. 30, 2020

(54) THREE-DIMENSIONAL MEMORY ARRAY

(71) Applicant: Micron Technology, Inc., Boise, ID (US)

(72) Inventors: Paolo Fantini, Vimercate (IT); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/228,952

(22) Filed: Dec. 21, 2018

(51) Int. Cl.
- *H01L 27/24* (2006.01)
- *H01L 45/00* (2006.01)
- *G11C 13/00* (2006.01)

(52) U.S. Cl.
CPC ...... *H01L 27/2481* (2013.01); *H01L 45/1233* (2013.01); *H01L 45/144* (2013.01); *H01L 45/1675* (2013.01); *G11C 13/004* (2013.01); *G11C 13/0069* (2013.01)

(58) Field of Classification Search
CPC ............ H01L 27/2481; H01L 45/1233; H01L 45/144; H01L 45/1675; G11C 13/004; G11C 13/0069
USPC .......................................................... 257/4
See application file for complete search history.

(56) References Cited

U.S. PATENT DOCUMENTS

| | | | |
|---|---|---|---|
| 9,947,721 B2 | 4/2018 | Fantini | |
| 10,096,655 B1 | 10/2018 | Pellizzer | |
| 2009/0296476 A1 | 12/2009 | Shin et al. | |
| 2012/0132981 A1* | 5/2012 | Imamura | H01L 27/11556 257/321 |
| 2014/0217349 A1* | 8/2014 | Hopkins | H01L 45/06 257/4 |
| 2016/0071861 A1 | 3/2016 | Serov et al. | |
| 2016/0126292 A1 | 5/2016 | Yanagida et al. | |
| 2017/0148808 A1 | 5/2017 | Nishikawa et al. | |
| 2018/0138190 A1 | 5/2018 | Yasuda | |

OTHER PUBLICATIONS

U.S. Appl. No. 16/156,194 entitled, "Three-Dimensional Memory Array" filed Oct. 10, 2018, (40 pgs.).
International Search Report and Written Opinion from related International Application No. PCT/US2019/066014, dated Apr. 10, 2020, 13 pages.

* cited by examiner

*Primary Examiner* — Tong-Ho Kim
(74) *Attorney, Agent, or Firm* — Brooks, Cameron & Huebsch, PLLC

(57) ABSTRACT

An example three-dimensional (3-D) memory array includes a substrate material including a plurality of conductive contacts arranged in a staggered pattern and a plurality of planes of a conductive material separated from one another by a first insulation material formed on the substrate material. Each of the plurality of planes of the conductive material includes a plurality of recesses formed therein. A second insulation material is formed in a serpentine shape through the insulation material and the conductive material. A plurality of conductive pillars are arranged to extend substantially perpendicular to the plurality of planes of the conductive material and the substrate and each respective conductive pillar is coupled to a different respective one of the conductive contacts. A chalcogenide material is formed in the plurality of recesses such that the chalcogenide material in each respective recess is formed partially around one of the plurality of conductive pillars.

26 Claims, 14 Drawing Sheets

SECTION C-C'

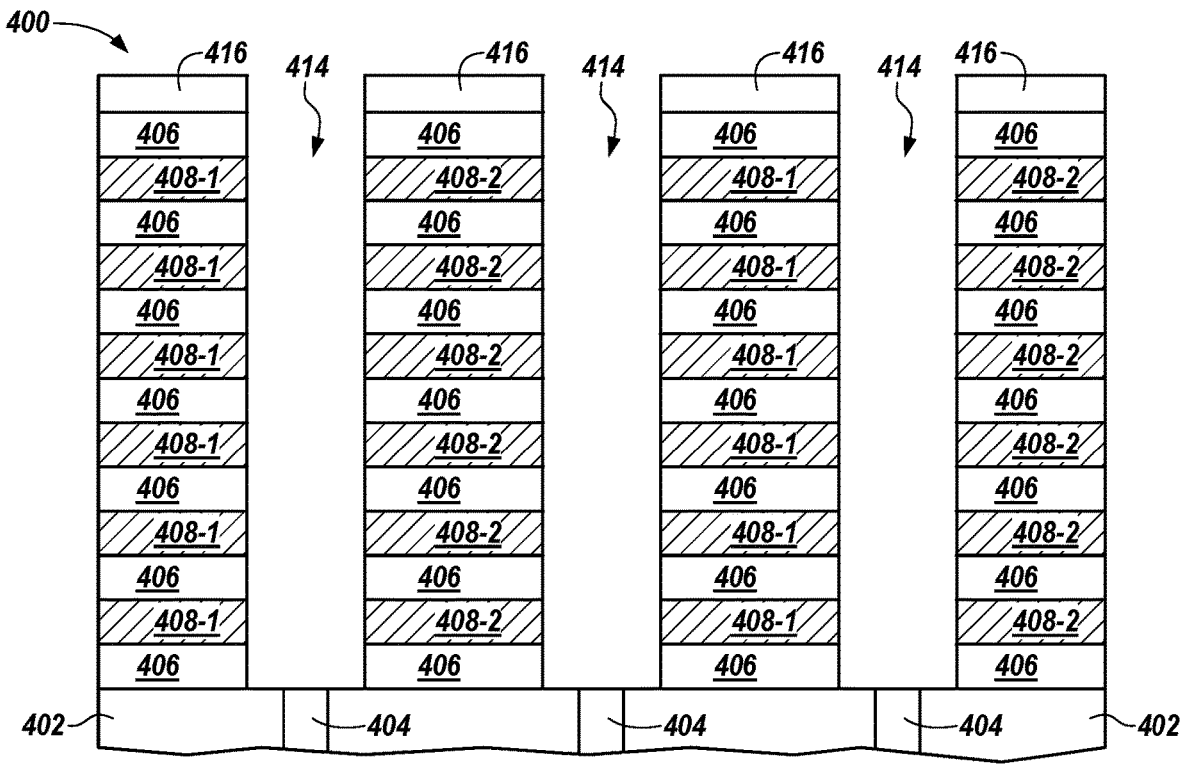
Fig. 4B SECTION A-A'
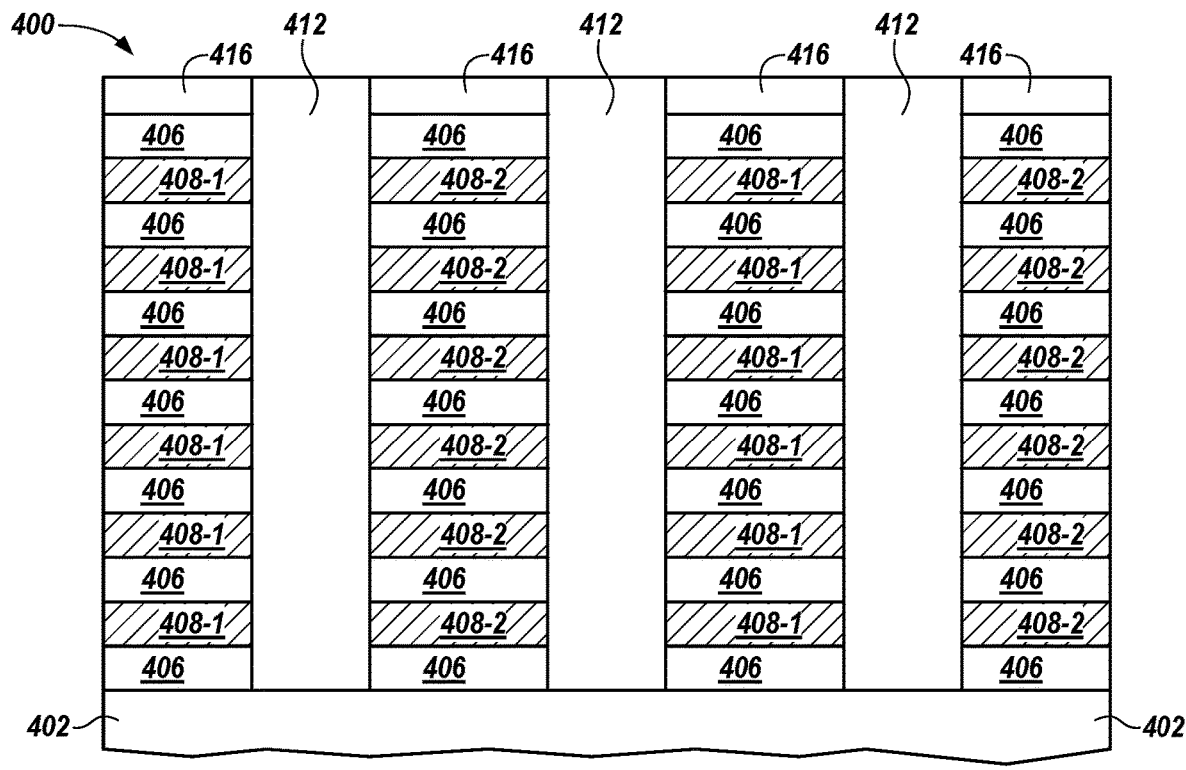
Fig. 4C SECTION B-B'

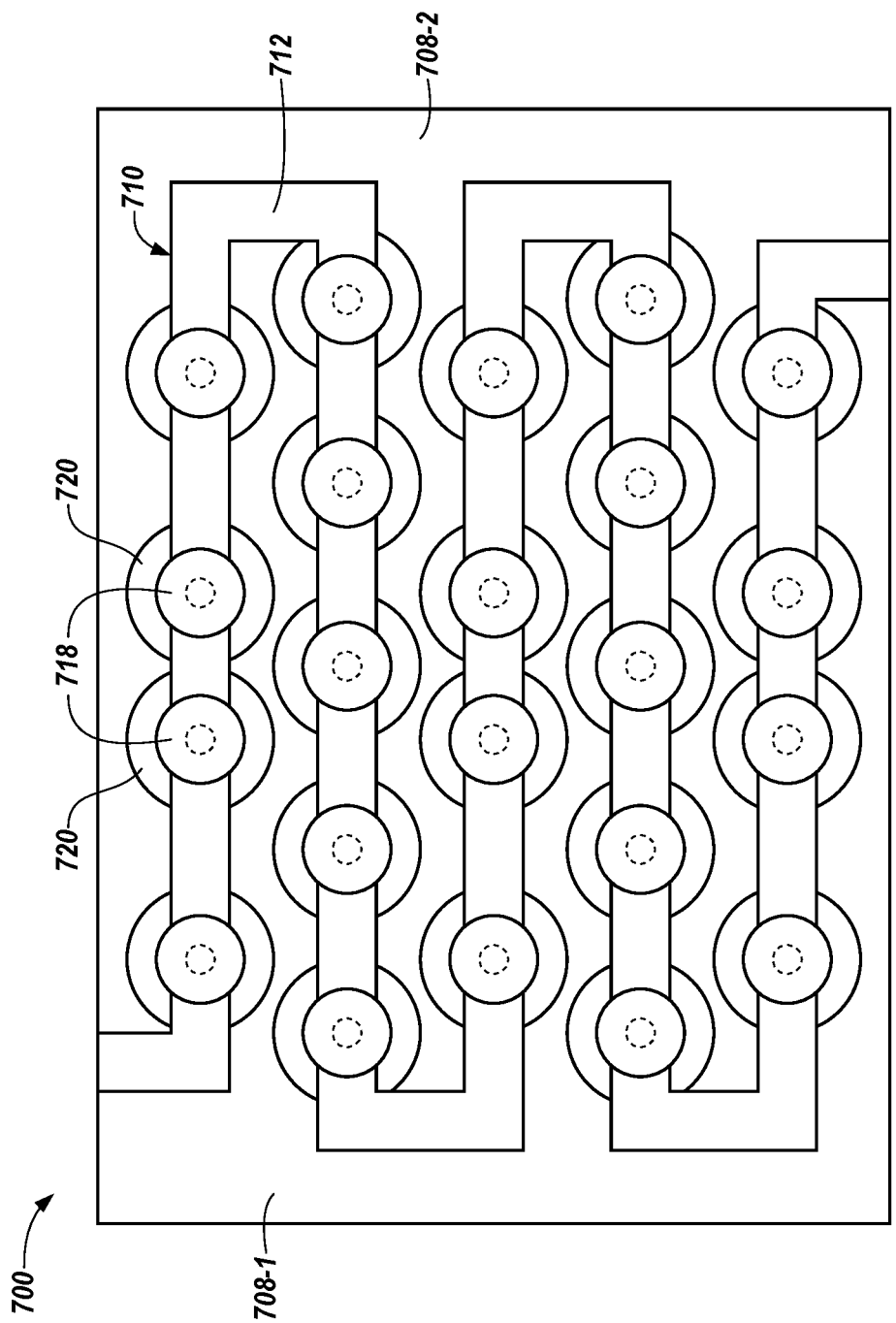
Fig. 7B    SECTION C-C'

THREE-DIMENSIONAL MEMORY ARRAY

TECHNICAL FIELD

The present disclosure relates generally to semiconductor memory and methods, and more particularly, to three-dimensional (3-D) memory arrays.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

One of a number of data states (e.g., resistance states) can be set for a resistive memory cell. For example, a single level memory cell (SLC) can be programmed to a targeted one of two different data states, which can be represented by the binary units 1 or 0 and can depend on whether the cell is programmed to a resistance above or below a particular level. As an additional example, some resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells because each cell can represent more than one digit (e.g., more than one bit).

BRIEF DESCRIPTION OF THE DRAWINGS

FIGS. 4A-4C illustrate various views of a subsequent processing step associated with forming the 3-D memory array in accordance with an embodiment of the present disclosure.

FIGS. 7A and 7B illustrate various views of a subsequent processing step associated with forming the 3-D memory array in accordance with an embodiment of the present disclosure.

DETAILED DESCRIPTION

Figure 1:
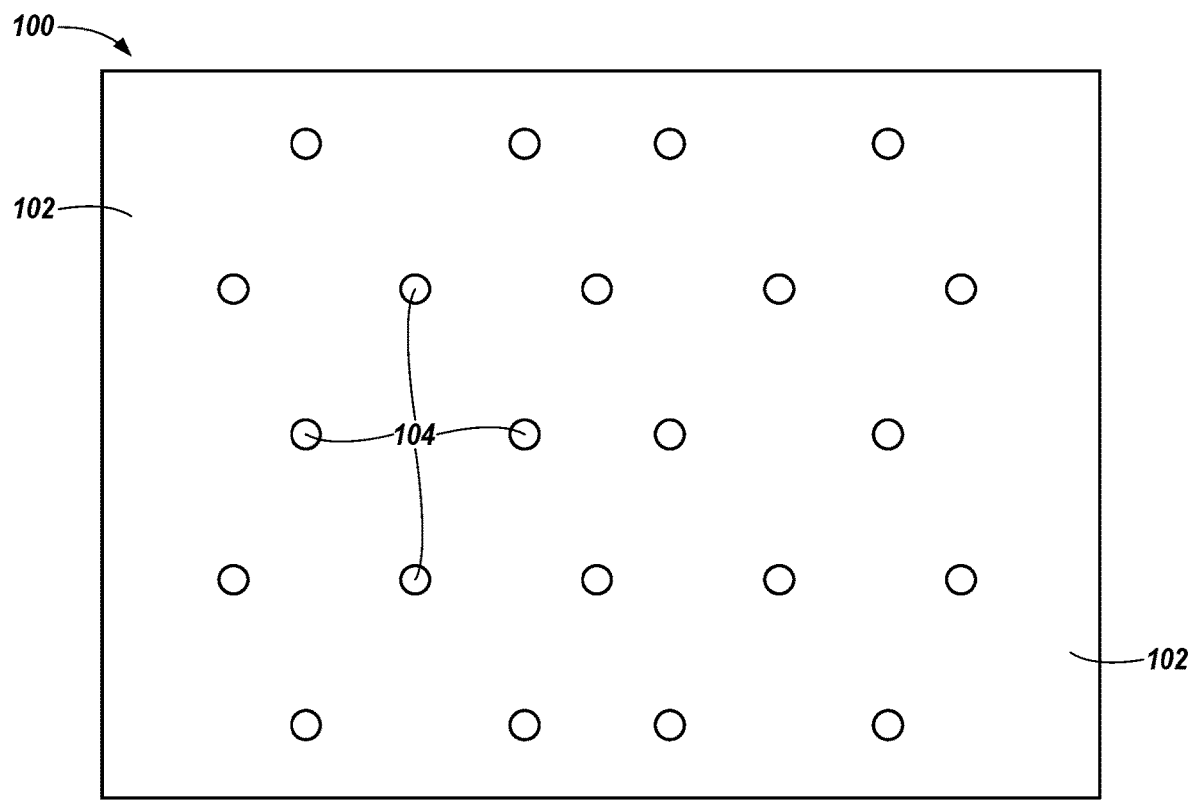
FIG. 1 illustrates a bottom view of a processing step associated with forming a three dimensional (3-D) memory array in accordance with an embodiment of the present disclosure.

The present disclosure includes 3-D memory arrays, and methods of processing the same. A number of embodiments include a substrate material including a plurality of conductive contacts arranged in a staggered pattern and a plurality of planes of a conductive material separated from one another by a first insulation material formed on the substrate material. Each of the plurality of planes of the conductive material can include a plurality of recesses formed therein. A second insulation material can be formed in a serpentine shape through the insulation material and the conductive material. A plurality of conductive pillars can be arranged to extend substantially perpendicular to the plurality of planes of the conductive material and the substrate. Each respective one of the plurality of conductive pillars can be coupled to a different respective one of the conductive contacts. A chalcogenide material can be formed in the plurality of recesses such that the chalcogenide material in each respective one of the plurality of recesses is formed partially around one of the plurality of conductive pillars.

A 3-D memory array in accordance with the present disclosure can have an increased density of memory cells (e.g., increased bit density) as compared with previous 3-D memory arrays. For example, the density of memory cells per conductive line in a 3-D memory array in accordance with the present disclosure can be double that of previous 3-D memory arrays.

A 3-D memory array in accordance with the present disclosure includes a staggered arrangement (e.g., a hexagonal arrangement) of conductive contacts and openings through alternating layers of conductive material and insulation material. The staggered arrangement can decrease the spacing between the openings while maintaining a dielectric thickness to sustain the voltage(s) to be applied to the 3-D memory array.

An opening (e.g., a trench) can be is formed through the alternating planes of conductive material (e.g., a conductive line material) and insulation material. The trench can be a serpentine-shaped trench. For instance, the trench can be in line with a row of the conductive contacts in a first direction and in line with an adjacent row of the conductive contacts in a second direction that is opposite to the first direction, for example, as described in association with FIG. 3 below. The trench can be filled with an insulation material. The insulation material in the trench can bifurcate each plane of the conductive material into two portions. Each portion of a plane of the conductive material can be a different access line. Access lines may be referred to as words lines and data lines may be referred to as bit lines.

A plurality of openings can be formed, in line with the trench, through the alternating planes of conductive material and insulation material. A storage element material (e.g., a chalcogenide material) and a conductive pillar can be formed in each of the openings. As explained herein, the trench increases the number of memory cells of the 3-D memory array, while reducing the capacitance of each floor of the 3-D memory array and the disturbances between adjacent floors of the 3-D memory array. As used herein, a "floor" of a 3-D memory array refers to a level of the 3-D memory array. For example, a plane of the conductive material and an adjacent plane of the insulation material can be a floor of the 3-D memory array.

A metallic material (e.g., vias) can be coupled to the conductive pillars in an orthogonal orientation relative to the openings such that each memory cell of the 3-D memory array can be addressed univocally by a pair of conductive lines of the 3-D memory array (e.g., a data line and an access line). For instance, each memory cell of the 3-D memory array may have only one possible address; for example, one of the conductive pillars (e.g., one data line of a plurality of data lines) and one portion of one of the planes of conductive material (e.g., one access line of a plurality of access lines).

As used herein, "a" or "an" can refer to one or more of something, and "a plurality of" can refer to more than one of such things. For example, a memory cell can refer to one or more memory cells, and a plurality of memory cells can refer to two or more memory cells. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected and, unless stated otherwise, can include a wireless connection.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2.

FIG. 1 illustrates a bottom view of a processing step associated with forming a 3-D memory array 100 in accordance with an embodiment of the present disclosure. As shown in FIG. 1, a plurality of conductive contacts 104 are formed in a plane of a substrate material 102. The substrate material 102 can be an insulation material. For example, the substrate material 102 can be a dielectric material, such as a dielectric film. As illustrated in FIG. 1, the plurality of conductive contacts 104 can be arranged in a staggered pattern, such as a hexagonal pattern. For example, a respective one of the plurality of conductive contacts 104 can be surrounded by six other conductive contacts 104.

As used herein, "a staggered pattern" refers to a plurality of conductive contacts that are adjacent to one another one direction but not in another direction. For example, a staggered pattern may have conductive contacts adjacent to one another in the x-direction (e.g., rows), but not in the y-direction (e.g., columns). For instance, as illustrated in FIG. 1, the plurality of conductive contacts 104 are adjacent to each other and in line with each other in an x-direction. However, the plurality of conductive contacts 104 are not adjacent to each other in the y-direction. The plurality of conductive contacts 104 are in line with each other in the y-direction but the plurality of conductive contacts 104 alternate (e.g., skip) rows in the y-direction. Although, FIG. 1 shows varying spacing between the conductive contacts 104, embodiments in accordance with the present disclosure are not so limited. For example, the spacing between the conductive contacts 104 can be approximately the same throughout the substrate material 102.

Figure 2:
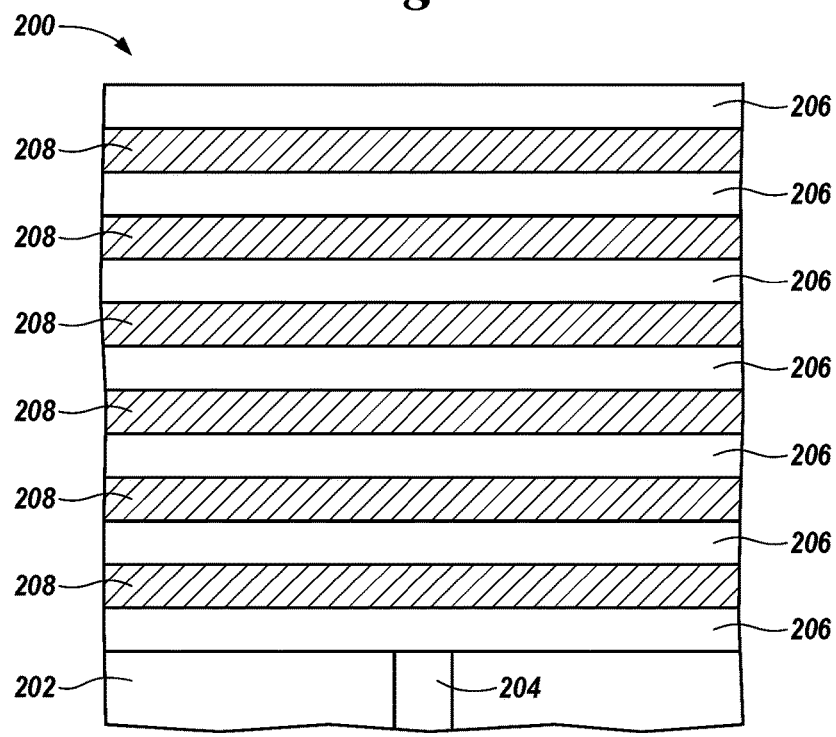
FIG. 2 illustrates a side view of a subsequent processing step associated with forming the 3-D memory array in accordance with an embodiment of the present disclosure.

FIG. 2 illustrates a side view of a subsequent processing step associated with forming the 3-D memory array 200 in accordance with an embodiment of the present disclosure. FIG. 2 shows a plurality of planes of a conductive material 208 separated in a z-direction (e.g., separated vertically) from one another by a plurality of planes of an insulation material 206. For example, a first plane (e.g., a bottom plane) of the insulation material 206 can be formed (e.g., deposited) on the plane of the substrate material 202, and then a plane of the conductive material 208 can be formed on the first plane of the insulation material 206. Additional planes of the insulation material 206 can be formed on the conductive material 208 in an alternating manner as illustrated in FIG. 2. The insulation material 206 can be a dielectric material, such as a dielectric film. In an embodiment, the insulation material 206 and the substrate material 202 can be the same type of insulation material.

Each respective one of the plurality of planes of the conductive material 208 can be at (e.g., form) a different level of the 3-D memory array 200, hereinafter referred to as a floor of the 3-D memory array 200. The conductive material 208 can comprise (e.g., be formed of) a metallic (or semi-metallic) material or a semiconductor material such as a doped polysilicon material, among others. In an embodiment, the conductive material 208 can be a plane of conductive carbon. Examples of the insulation material 206 include, but are not limited to dielectric materials, such as silicon oxide. Six planes of the conductive material 208 and seven planes of the insulation material 206 are shown in FIG. 2. The seventh plane of the insulation material 206 can be a topmost layer of the 3-D memory array 200. The quantity of planes of the conductive material 208 and the insulation material 206 are not limited to the quantities illustrated in FIG. 2. The conductive material 208 and the insulation material 206 can be arranged into more than six floors or less than six floors.

Figure 3:
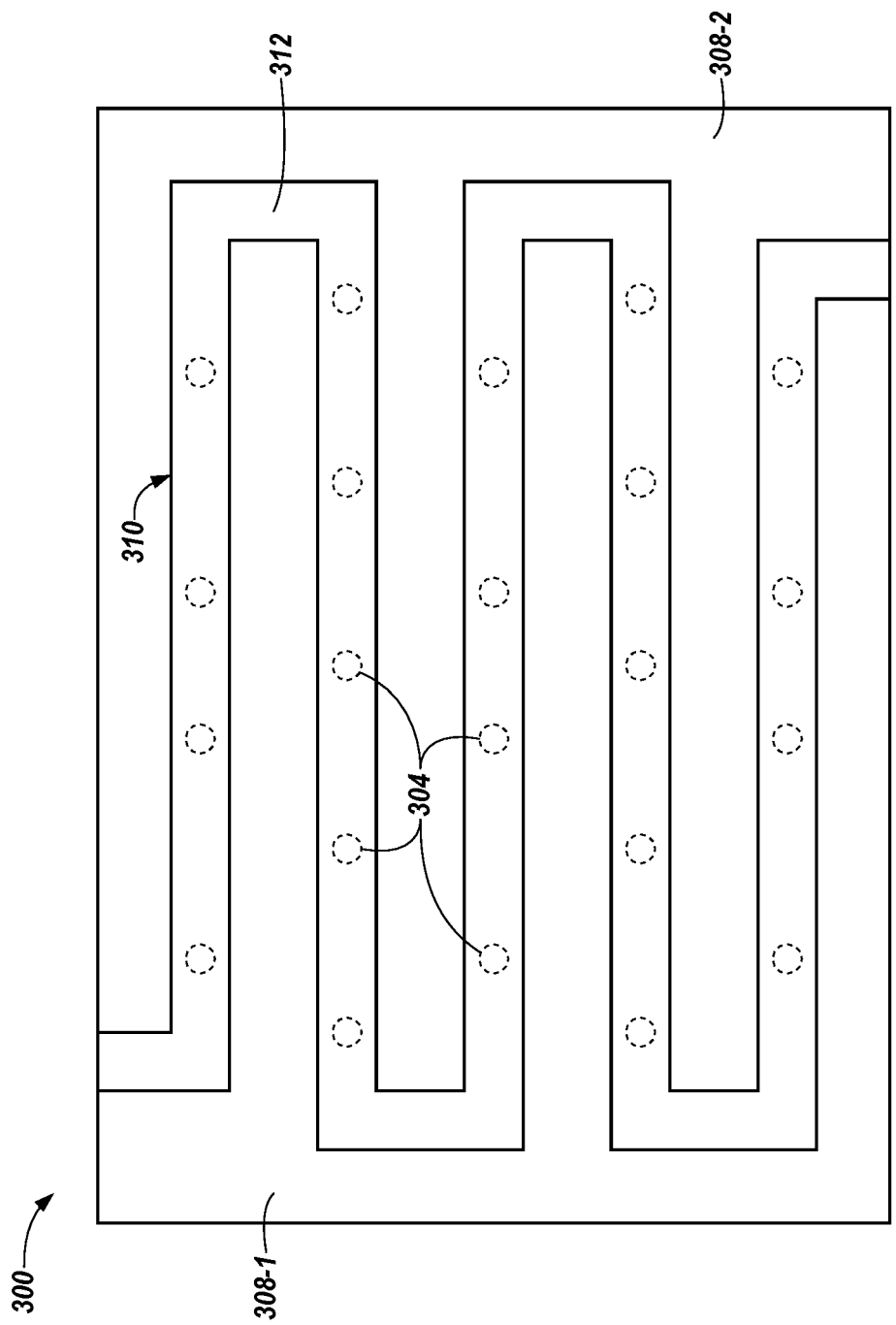
FIG. 3 illustrates a top view of a subsequent processing step associated with forming the 3-D memory array in accordance with an embodiment of the present disclosure.

FIG. 3 illustrates a top view of a subsequent processing step associated with forming the 3-D memory array 300 in accordance with an embodiment of the present disclosure. FIG. 3 is a cross-sectional view through any one of the planes of the conductive material 208 illustrated in FIG. 2 subsequent to formation of an opening (e.g., trench) 310. The trench 310 can be formed through the alternating planes of conductive material 208 and the insulation material 206 illustrated in FIG. 2. The substrate material 202 and the conductive contacts 304 can be the bottom of the trench as described in association with FIG. 4C below.

The trench 310 can be filled with an insulation material 312. The insulation material 312 can be a dielectric material. In an embodiment, the insulation material 312 and the substrate material 202 can be the same type of insulation material. The conductive contacts 304 are represented by dashed circles to indicate that the conductive contacts 304 are under the insulation material 312. In other words, the insulation material 312 is formed in the trench 310 and in contact with the plane of the insulation material 202 and the conductive contacts 304.

The trench 310 can be a serpentine-shaped trench. For instance, the trench 310 can pass over a row of the conductive contacts 304 in a first direction (e.g., from left to right) and then pass over an adjacent row of the conductive contacts 304 in a second direction that is opposite to the first direction (e.g., from right to left). With reference to the example of FIG. 3, the trench 310 passes over a first row of the conductive contacts 310 at the top of FIG. 3 from left to right, then "turns" and passes over the next (second) row of the conductive contacts 304 (adjacent to the first row) from right to left. The trench 310 "turns" again and passes over the next (third) row of the conductive contacts 304 (adjacent to the second row) from left to right. The trench 310 "turns" again and passes over the next (fourth) row of the conductive contacts 304 (adjacent to the third row) from right to left and then "turns" again and passes over the next (fifth) row of the conductive contacts 304 at the bottom of FIG. 3 (adjacent to the fourth row) from left to right. Thus, the insulation material 312 can be formed in a serpentine shape through the insulation material 202 and the conductive material 208.

The insulation material 312 and the trench 310 can bifurcate each plane of the conductive material 308 into two portions: a first portion 308-1 and a second portion 308-2. Each portion of a plane of the conductive material 308 can be a different access line (e.g., word line) of a floor. For example, the first portion 308-1 can be a first access line of a floor of the 3-D memory array 300 and the second portion 308-2 can be a second access line of the same floor of the 3-D memory array 300.

Figure 4A:
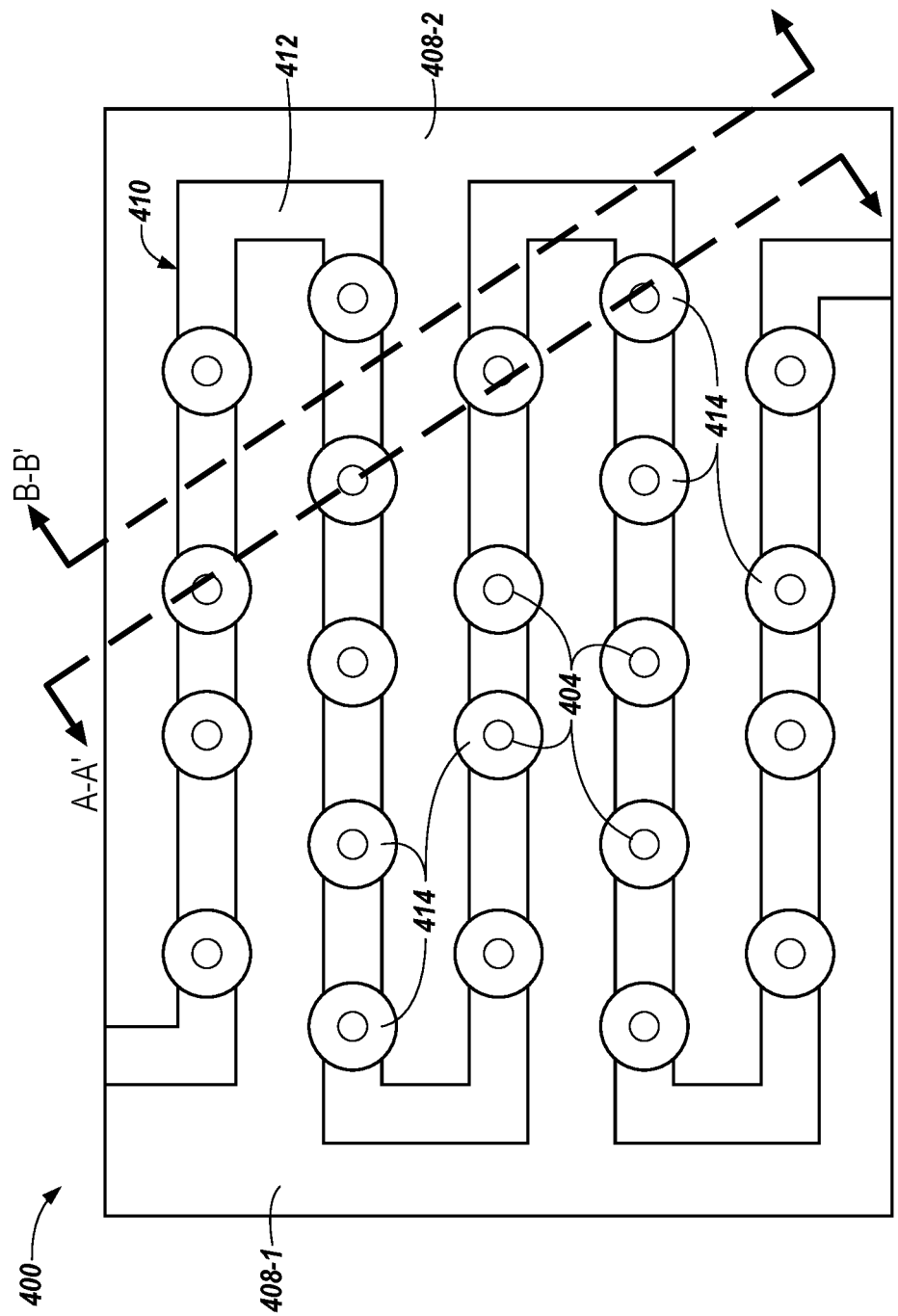

FIGS. 4A-4C illustrate various views of a subsequent processing step associated with forming the 3-D memory array 400 in accordance with an embodiment of the present disclosure. For example, FIG. 4A illustrates a top view through one of the planes of the conductive material 408 of the 3-D memory array 400 after the subsequent processing step. FIG. 4B illustrates a schematic cross-sectional view of the 3-D memory array 400 along section line A-A' after the subsequent processing step. FIG. 4C illustrates a schematic cross-sectional view of the 3-D memory array 400 along section line B-B' after the subsequent processing step.

As shown in FIGS. 4A and 4B, a plurality of openings 414 can be formed through the alternating planes of the conductive material 408 and the insulation material 406, and the insulation material 412 in the trench 410. The diameter of the plurality of openings 414 can be greater than the width of the trench 410. In an embodiment, a masking material 416 (e.g., a hard masking material) can be formed on the topmost plane of the insulation material 406 prior to forming the plurality of openings 414. The masking material 416 can have a slower etch rate than the conductive material 408, the insulation material 406, and the insulation material 412. In an embodiment, the masking material 416 can be removed subsequent to the formation of the plurality of openings 414.

The sidewall of each respective one of the plurality of openings 414 can be divided into four portions (not necessarily even quarters). The first portion of the sidewall of can be the first portion 408-1 of the conductive material 408 and the insulation material 406 in the alternating planes. The second portion, adjacent to the first portion, of the sidewall can be the insulation material 412 formed in the trench 410. The third portion, adjacent to the second portion, of the sidewall of can be the second portion 408-2 of the conductive material 408 and the insulation material 406 in the alternating planes. The fourth portion, adjacent to the third and first portions, of the sidewall can be the insulation material 412 formed in the trench 410. The substrate material 402 and the conductive contacts 404 can be the bottom of the plurality of openings 414.

Each of the plurality of openings 414 can be approximately concentric with a different respective one of the conductive contacts 404. Thus, the plurality of openings 414 can have the staggered (e.g., hexagonal) arrangement of the conductive contacts 404. Although, FIG. 4 shows varying spacing between the openings 414, embodiments in accordance with the present disclosure are not so limited. For example, the spacing between the openings 414 can be approximately the same. As shown in FIG. 4C, the insulation material 412 formed in the trench 410 between a pair of the openings 414 remains after the formation of the plurality of openings 414.

Figure 5:
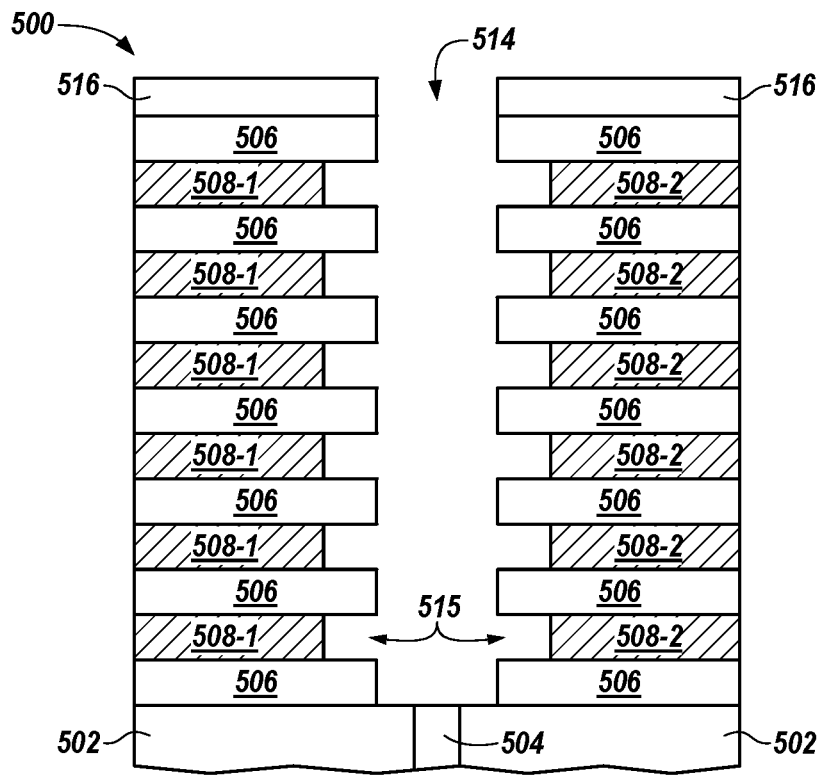
FIG. 5 illustrates a cross-sectional view of a subsequent processing step associated with forming the 3-D memory array in accordance with an embodiment of the present disclosure.

FIG. 5 illustrates a cross-sectional view of a subsequent processing step associated with forming the 3-D memory array 500 in accordance with an embodiment of the present disclosure. As shown in FIG. 5, a plurality of recesses 515 can be formed in the conductive material 508 in each of the planes. For example, a selective etching operation can be performed to form the plurality of recesses 515 in an isotropic way. The etching chemistry can be selected such that the conductive material 508 is etched faster than the insulation material 506. The selective etching operation can be a dry etching operation or a wet etching operation. In an embodiment, the masking material 516 can be removed subsequent to the formation of the plurality of recesses 515.

Figure 6:
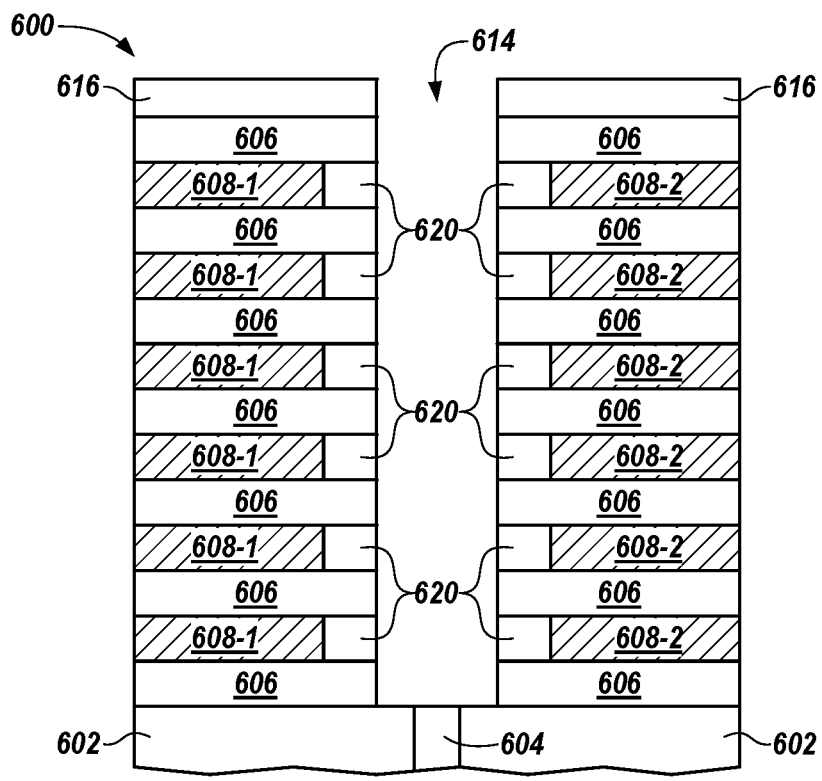
FIG. 6 illustrates a cross-sectional view of a subsequent processing step associated with forming the 3-D memory array in accordance with an embodiment of the present disclosure.

FIG. 6 illustrates a cross-sectional view of a subsequent processing step associated with forming the 3-D memory array 600 in accordance with an embodiment of the present disclosure. As shown in FIG. 6, a storage element material 620 can be formed in the plurality of recesses 515 illustrated in FIG. 5. The storage element material 620 can be a chalcogenide material, such as a chalcogenide alloy and/or glass, that can serve as a self-selecting storage element material (e.g., a material that can serve as both a select device and a storage element). For example, the storage element material 620 can be responsive to an applied voltage, such as a program pulse, applied thereto. For an applied voltage that is less than a threshold voltage, the storage element material 620 may remain in an electrically nonconductive state (e.g., an "off" state). Alternatively, responsive to an applied voltage that is greater than the threshold voltage, the storage element material 620 may enter an electrically conductive state (e.g., an "on" state). Further, the threshold voltage of the storage element material 620 in a given polarity can change based on the polarity (e.g., positive or negative) of the applied voltage. For instance, the threshold voltage can change based on whether the polarity of the program pulse is positive or negative.

Examples of chalcogenide materials that can serve as the storage element material 620 include indium(In)-antimony (Sb)-tellurium(Te) (IST) materials, such as $In_2Sb_2Te_5$, $In_1Sb_2Te_4$, $In_1Sb_4Te_7$, etc., and germanium(Ge)-antimony (Sb)-tellurium(Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. Other examples of chalcogenide materials include tellurium-arsenic (As)-germanium (OTS) materials, Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), Sulphur (S), nitrogen (N), carbon (C), yttrium (Y), and scandium (Sc) materials, and combinations thereof. The hyphenated chemical composition notation, as used herein, indicates the elements included in a particular mixture or compound, and is intended to represent all stoichiometries involving the indicated elements. In an embodiment, the chalcogenide material can be a chalcogenide glass or amorphous chalcogenide material.

The storage element material 620 can be formed in the recesses 515 by conformally depositing the storage element material 620. An etching operation, such as an etch-back operation can be performed subsequent to forming the storage element material 620 so that surfaces of the storage element material 620 (e.g., the surfaces facing into the opening 614 shown in FIG. 6) is approximately coplanar with surfaces of the insulation material 606 (e.g., the surfaces facing into the opening 614) as illustrated in FIG. 6. The etching operation can be a dry etching operation or a wet etching operation. Although FIG. 6 shows the storage element material 620 confined to the plurality of recesses 515, embodiments are not so limited. For example, during formation of the storage element material 620 in the plurality of recesses 515, the storage element material 620 may be formed on the sidewalls of the plurality of openings 614 (e.g., on the surfaces of the insulation material 606 facing into the opening 614).

Figure 7A:
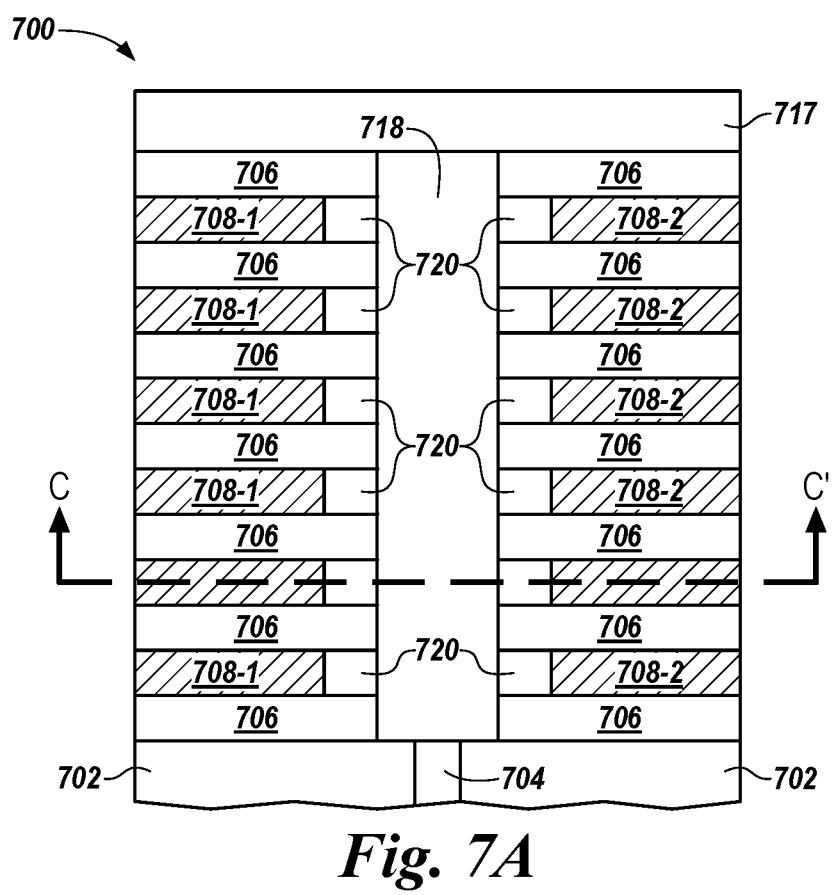

FIGS. 7A and 7B illustrate various views of a subsequent processing step associated with forming the 3-D memory array 700 in accordance with an embodiment of the present disclosure. For example, FIG. 7A illustrates a cross-sectional view of the subsequent processing step. FIG. 7B illustrates a top view along section line C-C' after the subsequent processing step.

As shown in FIGS. 7A and 7B, a conductive pillar 718 can be formed in each respective one of the plurality of openings 614 shown in FIG. 6. The conductive pillar 718 can be formed in contact with the conductive contact 704 and the insulation material 706 in the alternating planes, and in contact with the storage element material 720 formed in each respective recess 515 such that the storage element material 720 formed in each respective recess 515 is formed partially (e.g., not completely) around the conductive pillar 718. In an embodiment, the conductive pillar 718 can formed in contact with the storage element material 720 that may have formed on the sidewalls of the plurality of openings 614. In an embodiment, the conductive pillar 718 can comprise the conductive material 708. The conductive pillar 718 can be an electrode cylinder. Although FIGS. 7A and 7B illustrate the conductive pillar 718 as a solid cylinder, in an embodiment the conductive pillar 718 can be a hollow cylinder or toroidal (e.g., a tube). The conductive pillar 718 can comprise a metallic (or semi-metallic) material or a semiconductor material such as a doped polysilicon material, among others. However, other metallic, semi-metallic, or semiconductor materials can be used.

In the embodiment illustrated in FIGS. 7A and 7B, the conductive pillar 718 formed in each respective one of the plurality of openings 614 are arranged to extend substantially perpendicular to the alternating planes of the conductive material 708 and the insulation material 706. The storage element material 720 and the conductive pillar 718 formed in each respective one of the plurality of openings 614 are formed concentrically (e.g., with the conductive contacts 704) in a substantially circular shape. However, embodiments of the present disclosure are not limited to exact or quasi-exact circular shapes. For instance, as used herein, "concentric" can refer to structures that are substantially surrounding each other in any shape, including oval shapes, for instance.

As described in association with FIG. 3 above and as illustrated in FIGS. 7A and 7B, the insulation material 712 formed in the trench 710 bifurcates each plane of the conductive material 708 into a first portion 708-1 and a second portion 708-2. Because the storage element material 720 is formed in the recesses 615 in the conductive material 708, the insulation material 712 isolates the storage element material 720 in contact with the first portion 708-1 of the conductive material 708 in the planes from the storage element material 720 in contact with the second portion 708-2 of the conductive material 708 in the planes.

The 3-D memory array 700 can include a plurality of vertical stacks. Each respective stack can include the conductive pillar 718, the conductive contact 704 coupled to the conductive pillar 718, the storage element material 720 formed in contact with the first portion 708-1 and the conductive pillar 718, and the storage element material 720 formed in contact with the second portion 708-2 and the conductive pillar 718.

Although not shown in FIGS. 7A and 7B for clarity and so as not to obscure embodiments of the present disclosure, other materials may be formed before, after, and/or between the storage element material 720, and/or the conductive pillar 718, for example, to form adhesion layers or barriers against interdiffusion of materials and/or to mitigate composition mixing. Further, in the embodiment illustrated in FIGS. 7A and 7B, any portion of the storage element material 720 and/or the conductive pillar 718 that may have formed above the uppermost plane of the insulation material 706 has been removed by etching and/or chemical-mechanical polishing (CMP), for example, to isolate each respective conductive pillar 718 from each other. To further isolate each respective conductive pillar 718 from each other, an insulation material 717 can be formed on the conductive pillar 718 to cap the conductive pillars 718. The insulation material 717 can be a different insulation material than the insulation material 706.

In an embodiment, alternating planes of different insulation materials can be formed on the substrate material 702. The opening 312, the plurality of openings 414, and the plurality of recesses 515 can be formed in the alternating planes of different insulation materials as described in association with FIGS. 3-7B above. One of the alternating planes of different insulation materials can be removed and the conductive material 708 can be formed in its place. That is, one of the alternating planes of different insulation materials can be replaced with the conductive material 708 to form the conductive material 708 in the plurality of planes separated from one another by the insulation material 706. For example, one of the alternating planes of different insulation materials can be replaced with the conductive material subsequent to forming the plurality of recesses 515 or subsequent to forming the storage element material 720 in the plurality of recesses 515.

In an embodiment, referring back to FIG. 4A-4C, the plurality of openings 414 can be formed using an etch chemistry that has a different etch rate and/or etch selectivity with respect to the insulation material 412 than the insulation material 406 and the conductive material 408. For example, the etch chemistry can etch the insulation material 412 but not the insulation material 406 and the conductive material 408 in the alternating planes. As a result, the openings 414 can include a combination of a circular etch from the selective etch operation and the trench 410. The portion of the conductive material 408 facing into a respective one of the openings 414 can have a linear (e.g., flat) surface in contrast to the circular surface shown in FIG. 4A. Subsequent to the selective etch operation to form the openings 414, the plurality of recesses 515 can be formed. The shape of the storage element material 720 can be defined by one of the recesses 515 (e.g., an isotropic recession) formed in the trench 410. The conductive pillar 718 can have a partially curved surface and a partially linear (e.g., flat) surface because the openings 414 can be a combination of a circular etch from the selective etch operation and the trench 410.

Figure 8:
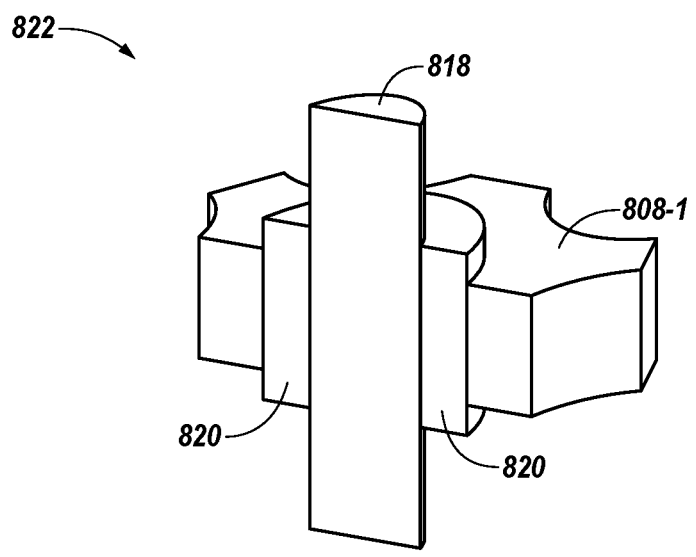
FIG. 8 illustrates a memory cell of the 3-D memory array illustrated in FIGS. 7A and 7B in accordance with an embodiment of the present disclosure.

FIG. 8 illustrates a memory cell 822 of the 3-D memory array 700 illustrated in FIGS. 7A and 7B in accordance with an embodiment of the present disclosure. Each respective memory cell 822 of the 3-D memory array 700 includes either the first portion 808-1 or the second portion 808-2 (not shown in FIG. 8) of one of the plurality of planes of the conductive material 808 and a portion of one conductive pillar 818 formed in a respective one of the plurality of openings 614. Each respective memory cell 822 of the 3-D memory array 700 also includes the storage element material 820 formed in the recess formed in either the first portion 808-1 or the second portion 808-2 of one of the plurality of planes of the conductive line material 808. The first portion 808-1 or the second portion 808-2 is substantially coplanar with, but electrically decoupled from, the portion of the conductive pillar 818. Thus, each respective memory cell 822 is substantially co-planar to the portion of its respective plane of the conductive material 808. There are two memory cells 822 for each respective pair of a conductive pillar 818 and a plane of the conductive material 808. For example, there are two memory cells 822 per floor of the 3-D memory array 700 as a result of the insulation material 712 formed in the trench 710 separating the storage element material 820 in contact with the first portion 808-1 from the storage element material 820 in contact with the second portion 808-2. Thus, the quantity of the memory cells 822 of the 3-D memory array 700 is doubled.

Because the storage element material 820 is formed in the recesses in the conductive material 808, the storage element material 820 can have curved surfaces with different dimensions. As illustrated in FIG. 8, the surface of the storage element material 820 in contact with the conductive material 808 is larger than the surface of the storage element material 820 in contact with the conductive pillar 818. The different areas of the opposing surfaces of the storage element material 820 can help with the window enlargement. Although FIG. 8 illustrates the storage element material 820 being thicker than the plane of the conductive material 808, embodiments are not so limited. For example, the storage element material 820 and the conductive material can have approximately the same thickness.

Figure 9:
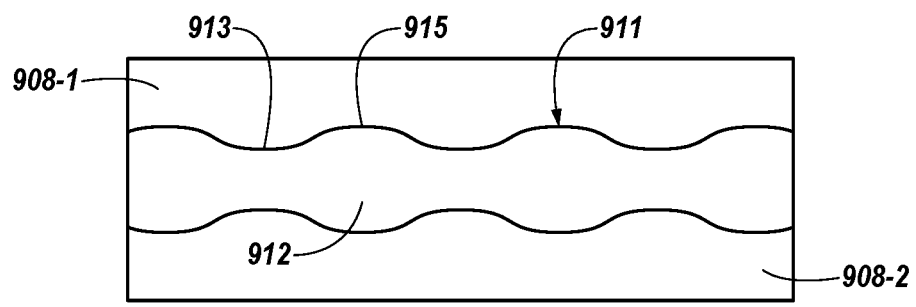
FIG. 9 illustrates a top view of a portion of a trench in accordance with an embodiment of the present disclosure.

FIG. 9 illustrates a top view of a portion of a trench 911 in accordance with an embodiment of the present disclosure. The trench 911 can be analogous to the trench 310 illustrated in FIG. 3, except in contrast to the trench 310, the trench 911 has a wave-like profile. The plurality of openings (e.g., the plurality of openings 414 illustrated in FIG. 4) can be formed near the narrow portion 913 of the trench 911 so that the wide portion 915 of the trench 910 is between the openings. An insulation material 912 can be formed in the trench 911, which can be analogous to the insulation material 412.

The wave-like profile of the trench 911 can provide an isotropic recession of the conductive material 908 so that the lateral thickness of the storage element material (e.g., the storage element material 720 illustrated in FIG. 7B) is constant along the length of the trench 911. The wave-like profile of the trench 911 can reduce, or minimize, variation in the length of the trench 911 that may be caused by the overlay variation between a mask (a "snake trench" mask) used in forming the serpentine trench 911 and a mask (a "vertical pillar" mask) used in forming the conductive pillars (e.g., the conductive pillars 718).

Figure 10:
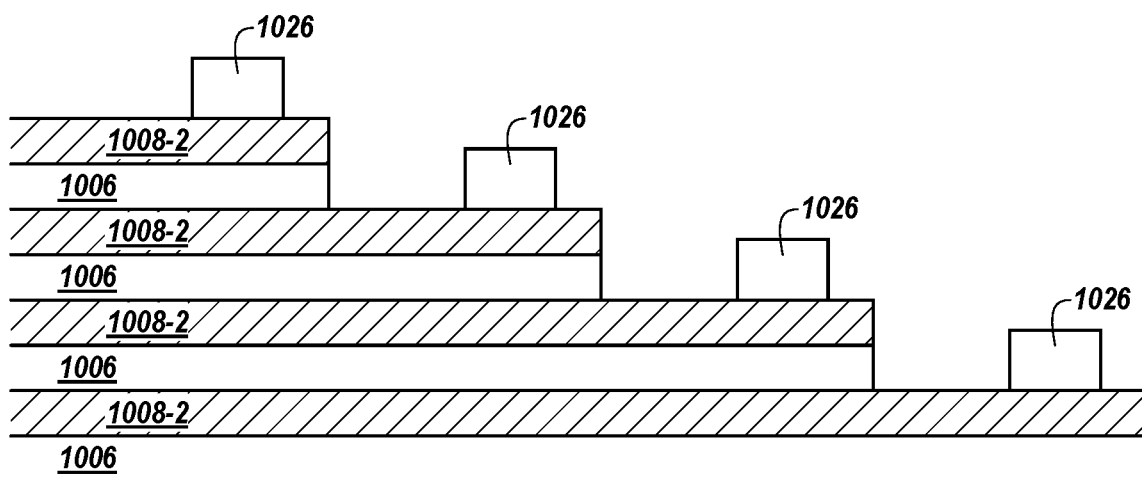
FIG. 10 illustrates a side view of a portion of a 3-D memory array in accordance with an embodiment of the present disclosure.

FIG. 10 illustrates a side view of a portion of a 3-D memory array 1000 in accordance with an embodiment of the present disclosure. As shown in FIG. 10, the planes of the conductive material 1008 can have staggered lengths so as to form "steps" on a side of the 3-D memory array 1000. Each respective "step" corresponds to a respective floor of the 3-D memory array 1000. A respective conductive contact 1026 is coupled to each portion of a respective plane of the conductive material 1008. FIG. 10 illustrates the conductive contacts 1026 coupled to the second portion 1008-2 of each floor of the 3-D memory array 1000. Although not illustrated in FIG. 10, the conductive contacts 1026 can be coupled to the first portion 1008-1 of each floor of the 3-D memory array 1000 on another side of the 3-D memory array 1000 (e.g., a mirror image of FIG. 10). The conductive contacts 1026 can be formed at or near an end of the "steps."

In an embodiment, a first plurality of conductive lines (e.g., vias) can be formed (e.g., deposited) in contact with the conductive contacts 704 illustrated in FIGS. 7A and 7B. For example, a conductive line of the first plurality can be coupled to a column of the conductive contacts (e.g., in a y-direction) as illustrated in FIG. 7B. The conductive pillars 718 coupled to the conductive contacts 704 can be referred to as local data lines whereas the first plurality of conductive lines coupled to the conductive contacts 704 can be referred to as global data lines.

A second plurality of conductive lines (e.g., vias) can be formed (e.g., deposited) in contact with the conductive contacts 1026. A conductive line of the second plurality can be formed in contact with each respective conductive contact 1026. That is, each respective conductive line of the second plurality is coupled to a single one of the conductive contacts 1026. The portions 1008-1 and 1008-2 of the planes of the conductive material 1008 can be referred to as local access lines whereas the second plurality of conductive lines coupled to the conductive contacts 1026 can be referred to as global access lines. Thus, each memory cell (e.g., the memory cell 822 illustrated in FIG. 8) of the 3-D memory array 1000 can be addressed individually via one conductive line of the first plurality and one conductive line of the second plurality.

The displacement of the first plurality of conductive lines and the second plurality of conductive lines for decoding the 3-D memory array 1000 can improve the area efficiency of a memory device (e.g., the memory device 1670 illustrated in FIG. 16) including the memory array 1000. The decoder circuitry (e.g., the decoder circuitry 1672) can be shared by multiple 3-D memory array blocks of the memory device 1670. As used herein, "decoder circuitry" can include and/or refer to row decoder circuitry and/or column decoder circuitry.

FIG. 10 shows a portion of four floors of the 3-D memory array 700 illustrated in FIG. 7A. However, the 3-D memory array 700 can include more than four floors or less than four floors.

Figure 11:
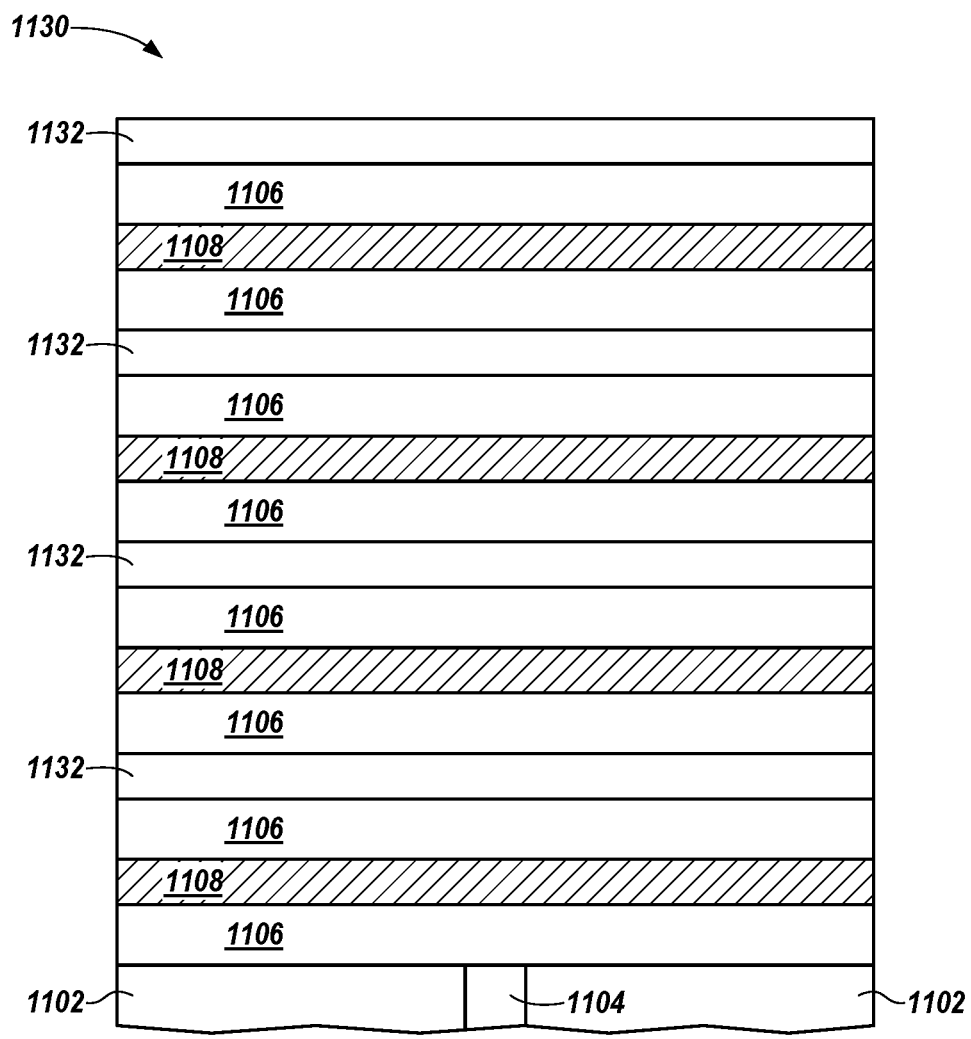
FIG. 11 illustrates a side view of a subsequent processing step associated with forming the 3-D memory array in accordance with an embodiment of the present disclosure.

FIG. 11 illustrates a side view of a subsequent processing step associated with forming the 3-D memory array 1130 in accordance with an embodiment of the present disclosure. The processing step illustrated in FIG. 11 is subsequent to the processing step illustrated in FIG. 1.

FIG. 11 shows an insulation material in a plurality of planes formed on opposing sides of a plurality of planes of a conductive material 1108. For example, a first plane of the insulation material 1106 can be formed (e.g., deposited) on the substrate material 1102 and then a plane of the conductive material 1108 can be formed on the first plane of the insulation material 1106. Then a second plane of the insulation material 1106 can be formed on the plane of the conductive material 1108. The insulation material 1106 and the conductive material 1108 can be the analogous to the insulation material 206 and the conductive material 208, respectively, illustrated in FIG. 2.

In contrast to the embodiment of FIG. 2, another insulation material 1132 is formed, in a plurality of planes, on the insulation material 1106. The insulation material 1132 can be a different insulation material than the insulation material 1106. For example, the insulation material 1106 can be an oxide material and the insulation material 1132 can be a nitride material. Alternatively, the insulation material 1106 can be a nitride material and the insulation material 1132 can be an oxide material. In an embodiment, the conductive material 1108 can be a graphene material, such as a thin plane of graphene. For example, the thickness of the plane of graphene can be approximately two nanometers. Additional planes of the insulation material 1106 and the conductive material 1108 can be formed as described above with additional planes of the insulation material 1132 formed in between as illustrated in FIG. 11.

Although not specifically illustrated, an opening (e.g., trench), such as the trench 310 described in association with FIG. 3 above, can be formed through the planes of the insulation material 1106, the conductive material 1108, and the insulation material 1132. The substrate material 1102 and the conductive contacts 1104 can be the bottom of the trench as described in association with FIG. 4C above. The trench can be filled with an insulation material, such as the insulation material 312. The trench can be a serpentine-shaped trench as described in association with FIG. 3 above.

Figure 12:
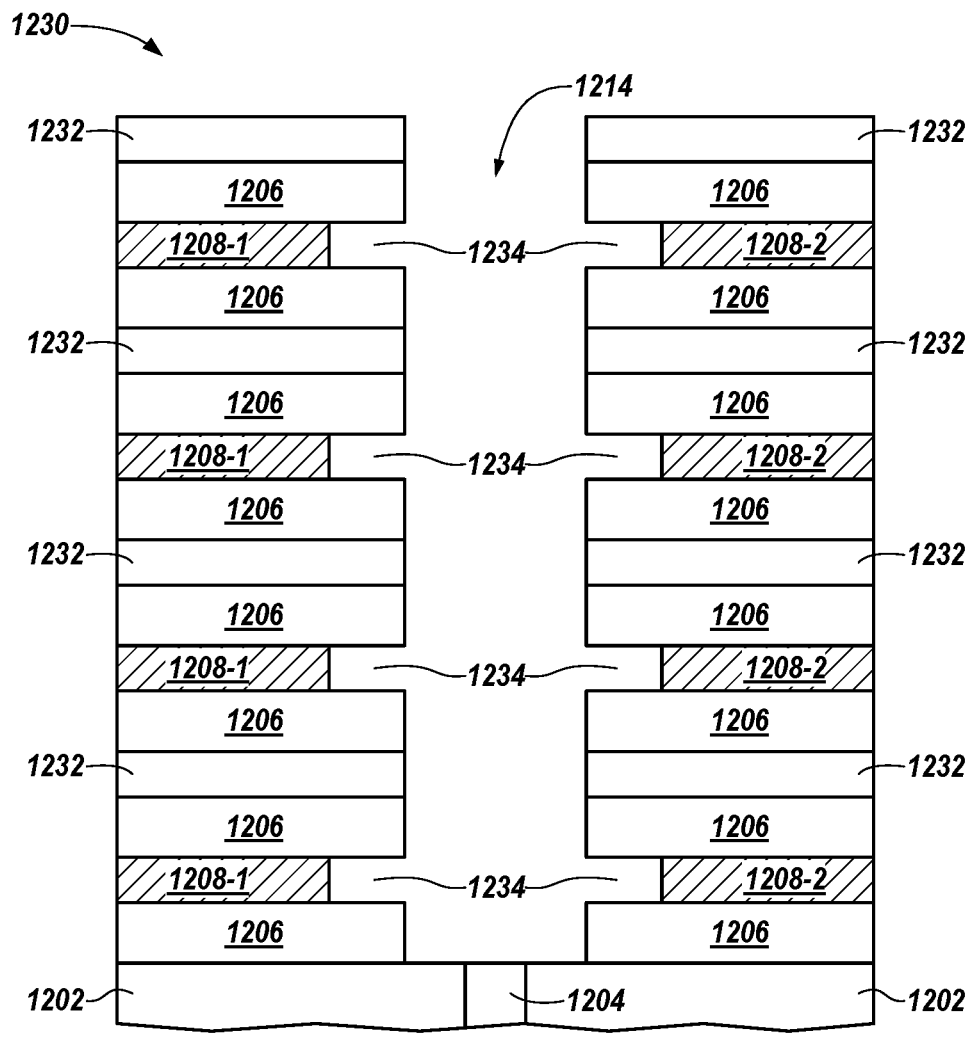
FIG. 12 illustrates a cross-sectional view of a subsequent processing step associated with forming the 3-D memory array in accordance with an embodiment of the present disclosure.

FIG. 12 illustrates a cross-sectional view of a subsequent processing step associated with forming the 3-D memory array 1230 in accordance with an embodiment of the present disclosure. Subsequent to forming the trench through the planes of the insulation material 1206, the conductive material 1208, and the insulation material 1232, a plurality of openings 1214 can be formed through the planes of the insulation material 1206, the conductive material 1208, and the insulation material 1232, and the insulation material in the trench. Each of the plurality of openings 1214 can be approximately concentric with a different respective one of conductive contacts 1204. Thus, the plurality of openings 1214 can have the staggered (e.g., hexagonal) arrangement of the conductive contacts 1204.

As shown in FIG. 12, a plurality of recesses 1234 can be formed in the conductive material 1208 in each of the planes. For example, a first selective etching operation can be performed to form the plurality of recesses 1234 in an isotropic way. The etching chemistry can be such that the conductive material 1208 is etched faster than the insulation materials 1206 and 1232. The first selective etching operation can be a dry etching operation or a wet etching operation. The plurality of recesses 1234 can be formed in a similar manner as the plurality of recesses 615 illustrated in FIG. 6.

Figure 13:
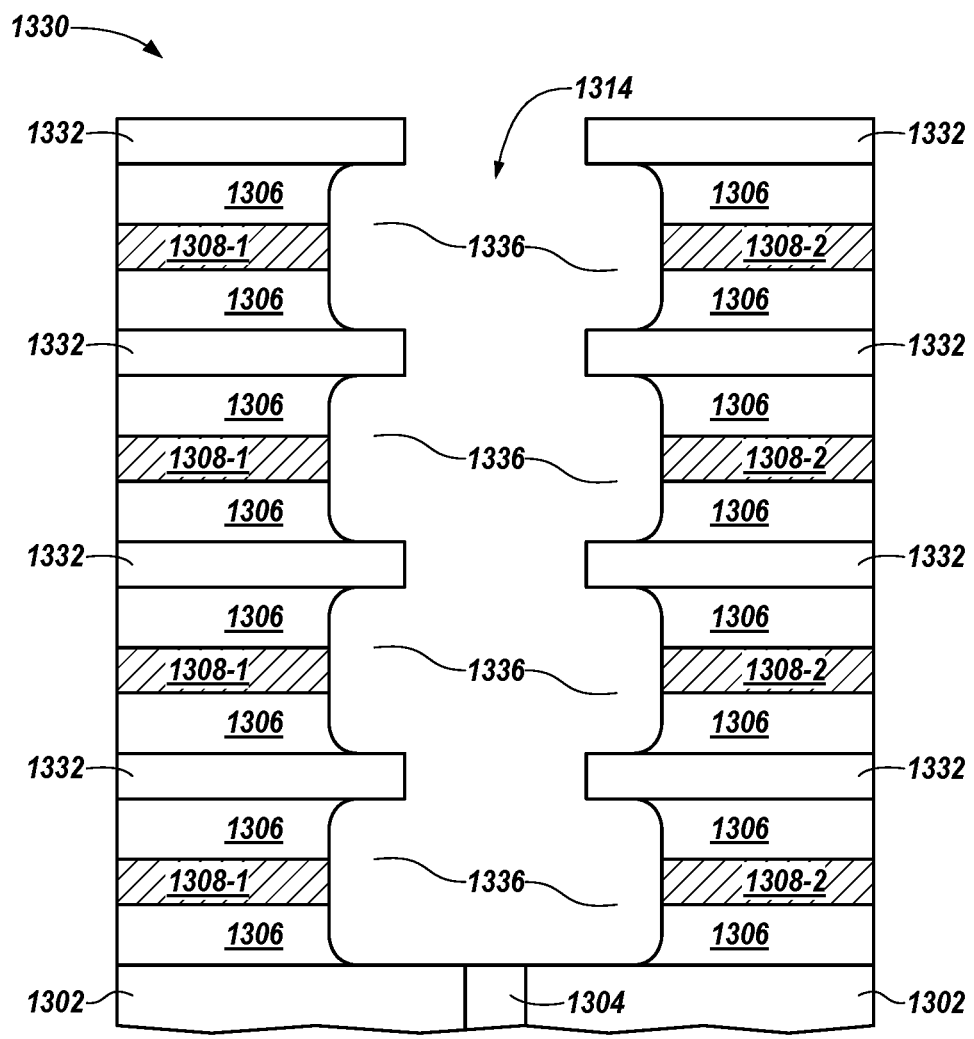
FIG. 13 illustrates a cross-sectional view of a subsequent processing step associated with forming the 3-D memory array in accordance with an embodiment of the present disclosure.

FIG. 13 illustrates a cross-sectional view of a subsequent processing step associated with forming the 3-D memory array 1330 in accordance with an embodiment of the present disclosure. Subsequent to the first selective etching operation illustrated in FIG. 12, a second selective etching operation can be performed to enlarge the recesses 1215 to form the recesses 1336 illustrated in FIG. 13. As shown in FIG. 13, the second selective etching operation removes a portion of the insulation material 1306 so that at least a portion of the insulation material 1306 is coplanar with the conductive material 1308. The etching chemistry of the second selective etching operation can have a high selectivity to the insulation material 1306 relative to the insulation material 1332.

Figure 14:
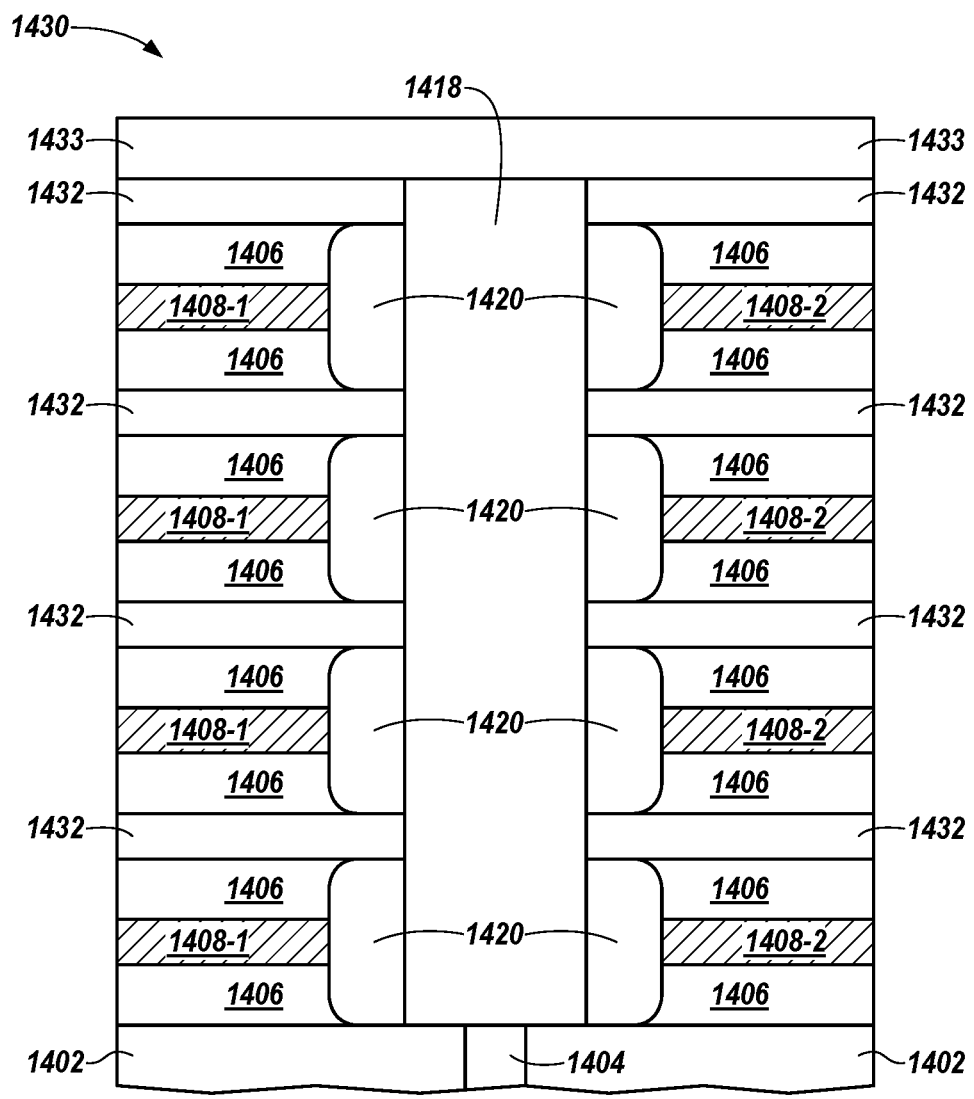
FIG. 14 illustrates a cross-sectional view of a subsequent processing step associated with forming the 3-D memory array in accordance with an embodiment of the present disclosure.

FIG. 14 illustrates a cross-sectional view of a subsequent processing step associated with forming the 3-D memory array 1432 in accordance with an embodiment of the present disclosure. As shown in FIG. 14, a storage element material 1420 can be formed in the plurality of recesses 1336 illustrated in FIG. 13. The storage element material 1420 can be analogous to the storage element material 620 described in association with FIG. 6 above. The storage element material 1420 can be formed in the recesses 1336 by conformally depositing the storage element material 1420. An etching operation, such as an etch-back operation can be performed subsequent to forming the storage element material 1420 so that surfaces of the storage element material 1420 (e.g., the surfaces facing into the opening 1314 is approximately coplanar with surfaces of the insulation material 1432 (e.g., the surfaces facing into the opening 1314) as illustrated in FIG. 14. The etching operation can be a dry etching operation or a wet etching operation. Although FIG. 14 shows the storage element material 1420 confined to the plurality of recesses 1336, embodiments are not so limited. For example, during formation of the storage element material 1420 in the plurality of recesses 1336, the storage element material 1420 may be formed on the sidewalls of the plurality of openings 1314 (e.g., on the surfaces of the insulation material 1332 facing into the opening 1314).

As shown in FIG. 14, a conductive pillar 1418 can be formed in each respective one of the plurality of openings 1314. The conductive pillar 1418 can be formed in contact with the conductive contact 1404, the insulation material 1432, the insulation material 1406 in each respective recess 1336, and in contact with the storage element material 1420 in each respective recess 1336 such that the storage element material 1420 formed in each respective recess 1336 is formed partially (e.g., not completely) around the conductive pillar 1418. In an embodiment, the conductive pillar 1418 can formed in contact with the storage element material 1420 that may have formed on the sidewalls of the plurality of openings 1314. The conductive pillar 1418 can be analogous to the conductive pillar 718 illustrated in FIGS. 7A and 7B. To further isolate each respective conductive pillar 1418 from each other, an insulation material 1433 can be formed on the conductive pillar 1418 to cap the conductive pillars 1418. The insulation material 1433 can be a different insulation material than the insulation materials 1406 and 1432.

As described in association with FIGS. 7A and 7B above, the insulation material formed in the trench (e.g., the insulation material 712 formed in the trench 710) bifurcates each plane of the conductive material 1408 into a first portion 1408-1 and a second portion 1408-2. Because the storage element material 1420 is formed in the recesses 1336 in the conductive material 1408 and the insulation material 1406, the insulation material in the trench isolates the storage element material 1420 in contact with the first portion 1408-1 of the conductive material 1408 in the planes from the storage element material 1420 in contact with the second portion 1408-2 of the conductive material 1408 in the planes.

Because the storage element material 1420 is formed in the recesses 1336 in the conductive material 1408 and the insulation material 1406, the storage element material 1420 has curved surfaces with different dimensions. The surface of the storage element material 1420 in contact with the conductive material 1408 and the insulation material 1406 is larger than the surface of the storage element material 1420 in contact with the conductive pillar 1418. The different areas of the opposing surfaces of the storage element material 1420 can help with the window enlargement. As compared to the 3-D memory array 700, the recesses 1336 of the 3-D memory array 1430 are larger than the recesses 615. Thus, the dimensions of the storage element material 1420 formed in the recesses 1336 are larger than the dimensions of the storage element material 720 formed in the recesses 615. As a result, the difference in the areas between the two contacts of the storage element material 1420 is increased. Thus, the electric field across a memory cell of the 3-D memory array 1430 is more non-uniform than the non-uniform electric field across a memory cell of the 3-D memory array 700. Consequently, the memory cells of the 3-D memory array 1430 can have an increased window enlargement as compared to the memory cells of the 3-D memory array 700.

Figure 15:
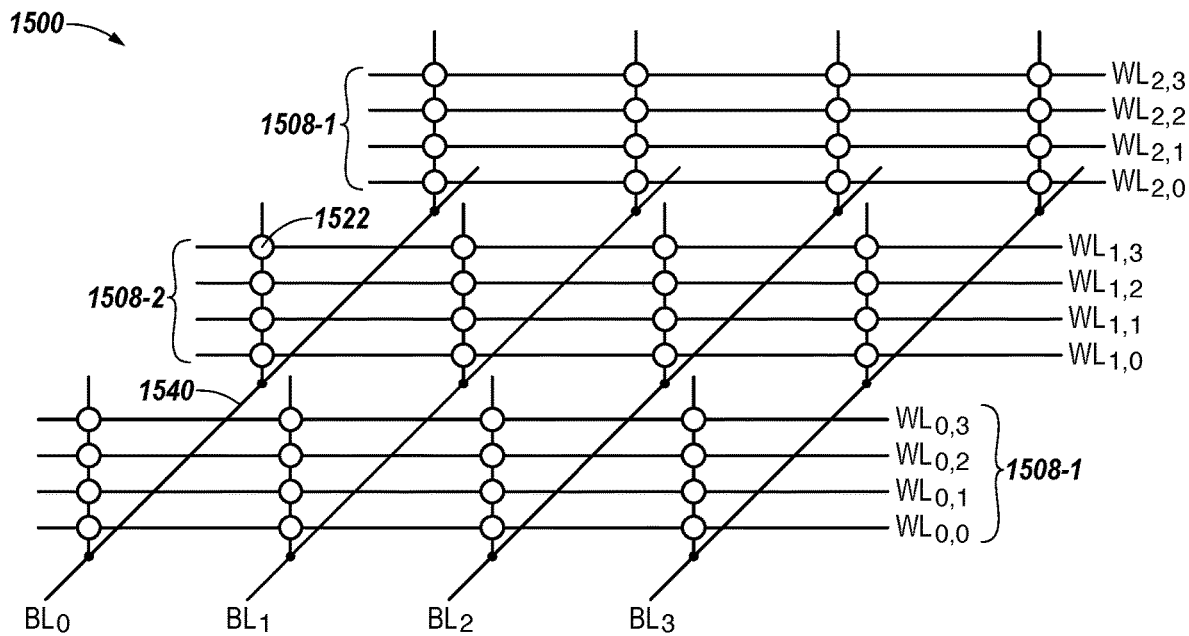
FIG. 15 illustrates a schematic of a 3-D memory array in accordance with an embodiment of the present disclosure.

FIG. 15 illustrates a schematic of a 3-D memory array 1500 in accordance with an embodiment of the present disclosure. The 3-D memory array 1500 can be analogous to the 3-D memory array 700 previously described in connection with FIGS. 7A and 7B and the 3-D memory array 1430 previously described in connection with FIG. 14. That is, the 3-D memory array 1500 can be processed according to the processing steps previously described herein (e.g., in connection with FIGS. 1-14). Although FIG. 15 illustrates a square or rectangular arrangement of a plurality of conductive lines 1508, a plurality of conductive lines 1540, and a plurality of memory cells 1522, it will be appreciated that FIG. 15 is a schematic representation of the 3-D memory array 1500 and that the plurality of conductive lines 1508, a plurality of conductive lines 1540, and a plurality of memory cells 1522 can be formed and arranged as described in association with FIGS. 1-14 above.

As shown in FIG. 15, access lines can be disposed on a plurality of floors (e.g., levels, elevations, decks, planes). For example, access lines can be disposed on N floors. An insulation material (not shown in FIG. 15 for clarity and so as not to obscure embodiments of the present disclosure) can separate the floors of access lines. As such, the floors of access lines separated by the insulation material can form a stack of access lines/insulation materials.

Data lines can be arranged substantially perpendicular to the access lines and located at a level above the N floors of access lines (e.g., at the N+1 level). Each data line can include a conductive pillar (e.g., the conductive pillar 714 illustrated in FIG. 7) in proximity to the access lines (e.g., the first portion 708-1), with a memory cell (e.g., the memory cell 822 illustrated in FIG. 8) formed between the conductive pillar and the access line. The topological and geometrical arrangement of the data lines and access lines is illustrated as orthogonal for simplicity. The data lines and access lines can be formed and arranged as described in association with FIGS. 1-14 above.

For example, the 3-D memory array 1500 can include a plurality of conductive lines 1508-1 and 1508-2 (e.g., access lines) and a plurality of conductive lines 1540 (e.g., data lines). The plurality of conductive lines 1508-1 can correspond to the first portion 708-1 or 1408-1 illustrated in FIGS. 7A, 7B, and 14. Similarly, the plurality of conductive lines 1508-2 can correspond to the second portion 708-2 or 1408-2 illustrated in FIGS. 7A, 7B, and 14. The plurality of conductive lines 1508-1 and 1508-2 can be analogous to the second plurality of conductive lines described in association with FIG. 10 above. The plurality of conductive lines 1540 can be analogous to the first plurality of conductive lines described in association with FIG. 10 above. The plurality of conductive lines 1508-1 and 1508-2 can be arranged into a plurality of floors. As illustrated in FIG. 15, the plurality of conductive lines 1508-1 and 1508-2 are arranged into four floors. However, the quantity of floors into which the plurality of conductive lines 1508-1 and 1508-2 can be arranged are not limited to this quantity; the plurality of conductive lines 1508-1 and 1508-2 can be arranged into more, or fewer, floors. The plurality of conductive lines 1508-1 and 1508-2 are arranged substantially parallel to one another within each respective floor. The plurality of conductive lines 1508-1 and 1508-2 can be aligned vertically in a stack. For instance, the plurality of conductive lines 1508-1 and 1508-2 in each of the multiple floors can be located at a same relative location within each respective floor so as to be aligned with the plurality of conductive lines 1508-1 and 1508-2 in the floor directly above and/or below. Insulation material (e.g., the insulation material 206 previously described in connection with FIG. 2; not shown in FIG. 15) can be located between the floors at which the plurality of conductive lines 1508-1 and 1508-2 are formed. An insulation material formed in the trench (e.g., the insulation material 712 formed in the trench 710 previously described in association with FIGS. 7A and 7B; not shown in FIG. 15) can be located between the plurality of conductive lines 1508-1 and 1508-2 of each respective floor.

As shown in FIG. 15, the plurality of conductive lines 1540 can be arranged substantially parallel to one another at a floor different than the floors at which the plurality of conductive lines 1508-1 and 1508-2 are located (e.g., above the floors at which the plurality of conductive lines 1508-1 and 1508-2 are located). For instance, the plurality of conductive lines 1540 (e.g., the first plurality of conductive lines) can be located at the bottom of the memory array 1500.

The indices shown in FIG. 15 for each of the plurality of conductive lines 1508-1 and 1508-2 indicate a particular floor and the position (e.g., ordering) of the plurality of conductive lines 1508-1 and 1508-2 within that floor. For example, the conductive line having the index $WL_{2,0}$ is located at position 2 within floor 0 (e.g., an access line of the 3-D memory array 1500 located at the bottom of a stack of access lines located at position 2). The conductive line having the index $WL_{2,3}$ is located at position 2 within floor 3 (e.g., an access line of the 3-D memory array 1500 located at the top of a stack of access lines located at position 2). The quantity of floors into which the plurality of conductive lines 1508-1 and 1508-2 can be arranged and the quantity of the plurality of conductive lines 1508-1 and 1508-2 at each floor can be greater, or fewer, than the quantities shown in FIG. 15.

At each overlapping of one of the plurality of conductive lines 1540 and a stack of the plurality of conductive lines 1508-1 and 1508-2, a conductive pillar (e.g., the conductive pillar 718) is oriented substantially perpendicular to the plurality of conductive lines 1540 and the plurality of conductive lines 1508-1 and 1508-2 so as to intersect a portion of each the plurality of conductive lines 1508-1 and 1508-2 in the stack. The conductive pillars are formed near (e.g., adjacent) the plurality of conductive lines 1508-1 and 1508-2, such that a memory cell 1522 is formed as previously described herein (e.g., in connection with FIG. 8).

The memory cells 1522 are arranged in a 3-D architecture near the location of where the conductive pillars and the plurality of conductive lines 1508-1 and 1508-2 are in proximity to one another at different floors. As such, the memory cells 1522 can be arranged in multiple floors, each floor having memory cells at intersections of the conductive pillars and the plurality of conductive lines 1508-1 and 1508-2. The floors of memory cells 1522 can be formed at different floors (e.g., vertically stacked). The 3-D memory array 1500 includes the memory cells 1522 having a common one of the plurality of conductive lines 1540, but separate ones of the plurality of conductive lines 1508-1 and 1508-2. For instance, each respective memory cell 1522 can be substantially co-planar to its respective one of the plurality of conductive lines 1508-1 and 1508-2. The memory cells 1522 can be formed substantially at the same floors as the plurality of conductive lines 1508-1 and 1508-2. The memory cells 1522 of the 3-D memory array 1500 can be coupled to decoder circuitry (not shown in FIG. 15). The decoder circuitry can be used to select a particular one of the memory cells 1522 during a program or sense operation, for example, as described further in association with FIG. 15.

Figure 16:
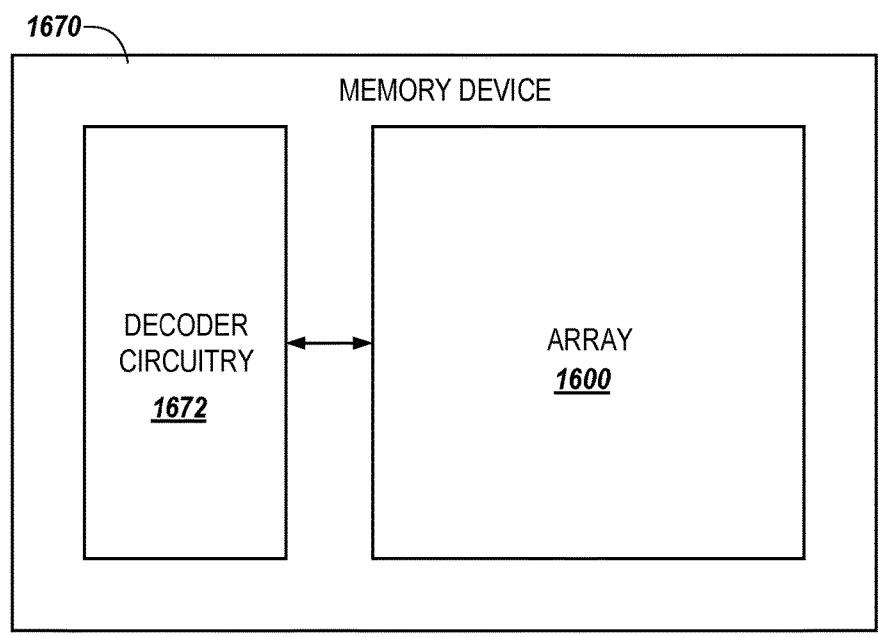
FIG. 16 is a block diagram of an apparatus in the form of a memory device in accordance with an embodiment of the present disclosure.

FIG. 16 is a block diagram of an apparatus in the form of a memory device 1670 in accordance with an embodiment of the present disclosure. As used herein, an "apparatus" can refer to, but is not limited to, any of a variety of structures or combinations of structures, such as a circuit or circuitry, a die or dies, a module or modules, a device or devices, or a system or systems, for example. As shown in FIG. 16, the memory device 1670 can include a 3-D memory array 1600. The 3-D memory array 1600 can be analogous the 3-D memory array 700 and/or 1430 previously described in connection with FIGS. 7A, 7B, and 14, respectively. Although FIG. 16 shows a single 3-D memory array 1600 for clarity and so as not to obscure embodiments of the present disclosure, the memory device 1670 may include any number of the 3-D memory array 1600.

As shown in FIG. 16, the memory device 1670 can include decoding circuitry 1672 coupled to the 3-D memory array 1600. The decoding circuitry 1672 can be included on the same physical device (e.g., the same die) as the 3-D memory array 1600. The decoding circuitry 1672 can be included on a separate physical device that is communicatively coupled to the physical device that includes the 3-D memory array 1600.

The decoding circuitry 1672 can receive and decode address signals to access the memory cells (e.g., the memory cells 1522 illustrated in FIG. 15) of the 3-D memory array 1600 during program and/or sense operations performed on the 3-D memory array 1600. For example, the decoding circuitry 1672 can include portions of decoder circuitry for use in selecting a particular memory cell of the 3-D memory array 1600 to access during a program or sense operation. For instance, a first portion of the decoder circuitry can be used to select a data line (e.g., one of the first plurality of conductive lines described in association with FIG. 10) and a second portion of the decoder circuitry can be used to select an access line (e.g., the second portion 1008-2 of one of the floors illustrated in FIG. 10). The conductive pillar (e.g., the conductive pillar 818 illustrated in FIG. 8) of the memory cell (e.g., the memory cell 822) can be selected, for example, using a selector, such as a vertical transistor, coupled to the conductive pillar. The decoding circuitry 1672 can, during a program operation or sense operation performed on the 3-D memory array 1600, apply an access voltage to the conductive pillar of one of the plurality of vertical stacks (e.g., the vertical stacks shown in and described in association with FIG. 15) and one of the plurality of conductive lines (e.g., one of the plurality of conductive lines 1508-1 and 1508-2).

The embodiment illustrated in FIG. 16 can include additional circuitry, logic, and/or components not illustrated so as not to obscure embodiments of the present disclosure. For example, the memory device 1670 can include a controller to send commands to perform operations on the 3-D memory array 1600, such as operations to sense (e.g., read), program (e.g., write), move, and/or erase data, among other operations. Further, the memory device 1670 can include address circuitry to latch address signals provided over input/output (I/O) connectors through I/O circuitry. Further, the memory device 1670 can include a main memory, such as, for instance, a DRAM or SDRAM, that is separate from and/or in addition to the memory array(s) 1600.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A three-dimensional (3-D) memory array, comprising:
   a substrate material including a plurality of conductive contacts arranged in a staggered pattern;
   a plurality of planes of a conductive material separated from one another by a first insulation material formed on the substrate material, wherein each of the plurality of planes of the conductive material includes a plurality of recesses formed therein;
   a second insulation material formed in a serpentine shape through the first insulation material and the conductive material;
   a plurality of conductive pillars arranged to extend substantially perpendicular to the plurality of planes of the conductive material and the substrate material, wherein each respective one of the plurality of conductive pillars is coupled to a different respective one of the conductive contacts; and
   a chalcogenide material formed in the plurality of recesses such that the chalcogenide material in each respective one of the plurality of recesses is formed partially around one of the plurality of conductive pillars.

2. The 3-D memory array of claim 1, wherein the staggered pattern of the plurality of conductive contacts is a hexagonal pattern.

3. The 3-D memory array of claim 1, further comprising a plurality of memory cells, wherein each respective memory cell includes:
   a portion of one of the plurality of planes of the conductive material;
   a portion of one of the conductive pillars; and
   a portion of the chalcogenide material formed in one of the plurality of recesses.

4. The 3-D memory array of claim 3, wherein each respective memory cell is substantially co-planar to the portion of its respective one of the plurality of planes of the conductive material.

5. The 3-D memory array of claim 1, further comprising a plurality of conductive lines coupled to the conductive contacts and substantially parallel to the plurality of planes of the conductive material.

6. The 3-D memory array of claim 1, further comprising a plurality of conductive lines coupled to the plurality of planes of the conductive material.

7. The 3-D memory array of claim 1, wherein the first and second insulation materials are each a dielectric material.

8. The 3-D memory array of claim 1, wherein the first insulation material and the second insulation material are a same insulation material.

9. The 3-D memory array of claim 1, wherein the second insulation material is in line with a row of the plurality of the conductive contacts in a first direction and is in line with an adjacent row of the plurality of the conductive contacts in a second direction opposite to the first direction.

10. The 3-D memory array of claim 1, wherein the second insulation material divides each of the plurality of planes of the conductive material into a first portion and a second portion.

11. The 3-D memory array of claim 10, wherein:
    the first portion of each the plurality of planes of the conductive material is a different access line of the 3-D memory array;
    the second portion of each the plurality of planes of the conductive material is a different access line of the 3-D memory array; and
    each of the plurality of conductive pillars is a different data line of the 3-D memory array.

12. The 3-D memory array of claim 10, further comprising circuitry configured to select either the first portion or the second portion of one of the plurality of planes of the conductive material and one of the conductive pillars during a program operation or sense operation performed on the 3-D memory array.

13. A method of processing a three-dimensional (3-D) memory array, comprising:
    forming a substrate material including a plurality of conductive contacts arranged in a staggered pattern;
    forming, on the substrate material, a first conductive material in a plurality of planes separated from one another by a first insulation material;
    forming a serpentine-shaped opening through the first conductive material in the plurality of planes and the first insulation material;
    forming a second insulation material in the serpentine-shaped opening;
    forming a plurality of openings, each concentric with a different one of the plurality of conductive contacts in the substrate material and through the first conductive material in the plurality of planes, the first insulation material, and the second insulation material;
    forming a plurality of recesses in the first conductive material in each of the plurality of planes;
    forming a chalcogenide material in the plurality of recesses; and
    forming a second conductive material in the plurality of openings and in contact with the chalcogenide material formed in each respective one of the plurality of recesses.

14. The method of claim 13, wherein forming the plurality of recesses includes selectively etching the first conductive material in the plurality of planes.

15. The method of claim 13, wherein the chalcogenide material formed in the plurality of recesses and the first conductive material in the plurality of planes form a sidewall of each of the plurality of openings.

16. The method of claim 13, further comprising forming a third insulation material on a topmost one of the plurality of planes of the first conductive material and the second conductive material.

17. The method of claim 13, further comprising coupling a metallic material to the plurality of the conductive contacts in the substrate material.

18. The method of claim 13, wherein forming the chalcogenide material includes conformally depositing of the chalcogenide material in the plurality of recesses.

19. The method of claim 13, further comprising:
forming, on the substrate material, a third insulation material in a plurality of planes separated from one another by the first insulation material; and
replacing the third insulation material in the plurality of planes with the first conductive material to form the first conductive material in the plurality of planes separated from one another by the first insulation material.

20. The method of claim 13, wherein forming the plurality of openings includes selectively etching the second insulation material formed in the serpentine-shaped opening.

21. A method of processing a three-dimensional (3-D) memory array, comprising:
forming a substrate material including a plurality of conductive contacts arranged in a staggered pattern;
forming, on the substrate material, a first conductive material in a first plurality of planes;
forming a first insulation material in a second plurality of planes on the first conductive material in the first plurality of planes;
forming a second insulation material in a third plurality of planes on the first insulation material in the second plurality of planes;
forming a serpentine-shaped opening through the first conductive material in the first plurality of planes, the first insulation material in the second plurality of planes, and the second insulation material in the third plurality of planes;
forming a third insulation material in the serpentine-shaped opening;
forming a plurality of openings, each concentric with a different one of the plurality of conductive contacts in the substrate material and through the first conductive material in the first plurality of planes, the first insulation material in the second plurality of planes, and the second insulation material in the third plurality of planes;
forming a plurality of recesses in the first conductive material in each of the first plurality of planes;
forming a chalcogenide material in the plurality of recesses; and
forming a second conductive material in the plurality of openings and in contact with the chalcogenide material formed in each respective one of the plurality of recesses.

22. The method of claim 21, wherein forming the plurality of recesses includes:
selectively etching the first insulation material in the second plurality of planes; and
selectively etching the second insulation material in the third plurality of planes.

23. A three-dimensional (3-D) memory array, comprising:
a plurality of conductive lines separated from one other in a first direction by a first insulation material and in a second direction substantial orthogonal to the first direction by a second insulation material formed in a serpentine shape through the plurality of conductive lines; and
a plurality of vertical stacks, wherein each respective one of the plurality of vertical stacks includes:
a conductive pillar arranged to extend substantially perpendicular to the plurality of conductive lines; and
a chalcogenide material formed in a plurality of recesses in the first insulation material and the second insulation material such that the chalcogenide material formed in each respective one of the plurality of recesses is formed partially around the conductive pillar,
wherein the chalcogenide material formed in a first one of the plurality of recesses is separated from the chalcogenide material formed in a second one of the plurality of recesses directly opposite the first one of the plurality of recesses by the second insulation material.

24. The 3-D memory array of claim 23, wherein the plurality of conductive lines comprise a graphene material.

25. The 3-D memory array of claim 23, further comprising circuitry configured to, during a program operation or sense operation performed on the array, apply an access voltage to the conductive pillar of one of the plurality of vertical stacks and one of the plurality of conductive lines.

26. The 3-D memory array of claim 23, wherein:
each respective one of the plurality of conductive lines is a different access line of the 3-D memory array; and
the conductive pillar of each respective one of the plurality of vertical stacks are communicatively coupled to a data line of the 3-D memory array.

* * * * *